United States Patent [19]

Kataoka et al.

[11] Patent Number: 5,227,721
[45] Date of Patent: Jul. 13, 1993

[54] SUPERCONDUCTIVE MAGNETIC SENSOR HAVING SELF INDUCED MAGNETIC BIASING

[75] Inventors: Shoei Kataoka, Tokyo; Hideo Nojima, Nara; Shuhei Tsuchimoto, Nara; Ryusuke Kita, Nara; Susumu Saitoh, Nara, all of Japan

[73] Assignee: Sharp Kabushiki Kaisha, Osaka, Japan

[21] Appl. No.: 593,898

[22] Filed: Oct. 5, 1990

Related U.S. Application Data

[62] Division of Ser. No. 289,312, Dec. 23, 1988, Pat. No. 5,011,818.

[30] Foreign Application Priority Data

Dec. 25, 1987 [JP] Japan ................................. 62-331008
Dec. 29, 1987 [JP] Japan ................................. 62-333970
Feb. 1, 1988 [JP] Japan ................................. 63-21610
Mar. 18, 1988 [JP] Japan ................................. 63-66664
Apr. 4, 1988 [JP] Japan ................................. 63-82448
May 13, 1988 [JP] Japan ................................. 63-117472

[51] Int. Cl.[5] .................... G01R 33/035; G01R 33/06
[52] U.S. Cl. ................................... 324/248; 324/252; 338/32 R; 338/32 S; 505/700
[58] Field of Search .......... 324/251, 252, 248, 207.14, 324/260-263; 505/1, 841, 842-848, 701, 705, 706, 711; 307/306; 361/19; 338/32 R, 32 S

[56] References Cited

U.S. PATENT DOCUMENTS

4,596,950 6/1986 Lienhard et al. ................. 324/252 X
4,649,342 3/1987 Nakamura ....................... 324/252 X
4,660,113 4/1987 Nomura et al. .................. 324/252 X

OTHER PUBLICATIONS

Tsuchimoto et al., "Novel Magnetic Sensor Using YBACUO Ceramic Superconductor Super Magneto-Resistor", *IEEE*, Dec. 8, 1987, pp. 867–868.
Nojima et al., "Galvonomagnetic Effect of a V-Ba-Ca-O Ceramic Superconductor and its Application . . . ", *Jap Jrnl. Appl. Phys.*, vol. 27, No. 5 May 1988, pp. 74–78.
Kita et al., "Highly Sensitive Magnetic Sensor Using $Y_1Ba_2Cu_3O_{7-x}$ Films", *FEDHiTcSc-Ed Wrkshp*, Jun. 2–4, 1988, pp. 231–234.
Minami et al., "Temperature Dependence of Anomaloas Magnetism of Hi-Tc Superconductors . . . ", *Jrnl. Appl. Phys.*, May 1987, pp. L783–L784.
Moffat et al., "Temperature Dependence of the Surface Resistivity at 1.5 GHz and 6 GHz . . . ", *Material Res. Soc. Symp.*, Apr. 5–9 1988, pp. 347–350.
Sun et al., "Superconductivity and Magnetism in the High-Tc Superconductor Y-Ba-Cu-O", *Phys. Rev. Lett.*, vol. 58, No. 15, pp. 1574–1576, Apr. 13, 1987.

*Primary Examiner*—Gerard R. Strecker
*Assistant Examiner*—W. Edmonds

[57] ABSTRACT

A superconductinve magneto-resistive device for use in a sensor system for sensing an external magnetic field which is formed so as to have a predetermined pattern for a current path through which a supplied current flows. The pattern includes portions formed close and parallel to each other so that magnetic fields induced by respective currents flowing through the portions can be cancelled with each other.

13 Claims, 12 Drawing Sheets magnetic flux density

Fig. 13 (II)

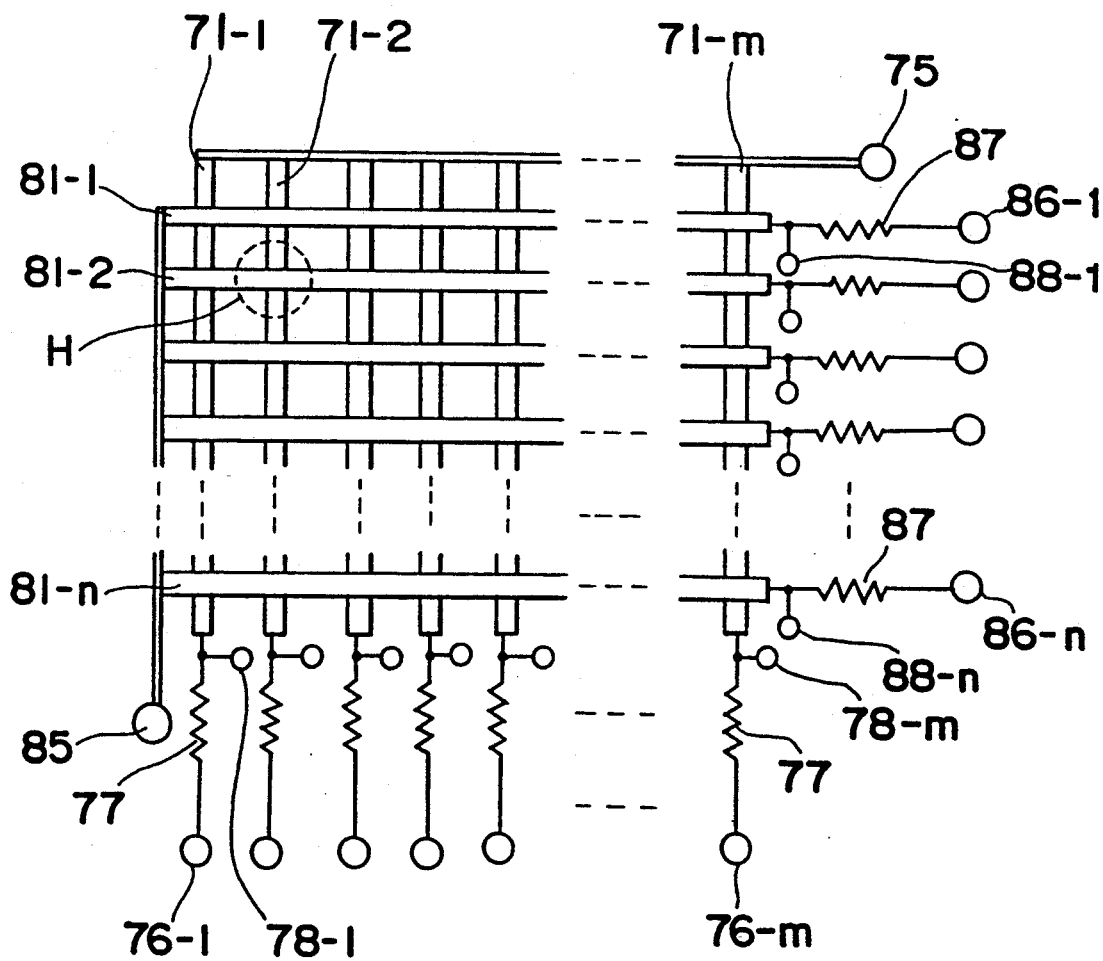
Fig. 13(III)

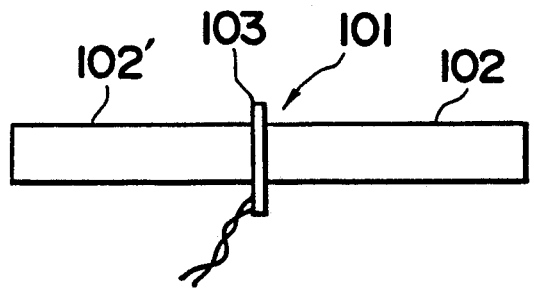
Fig. 16
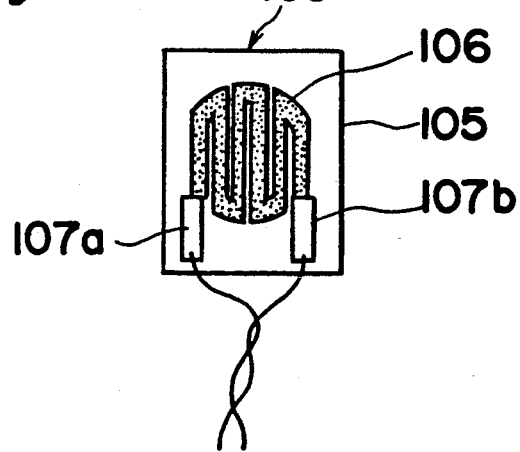
Fig. 17
Fig. 18(a)
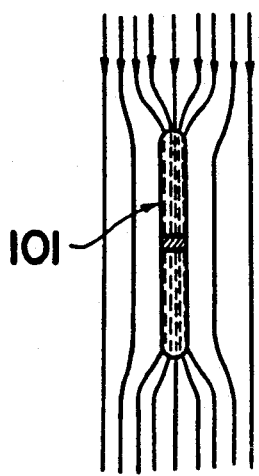
Fig. 18(b)
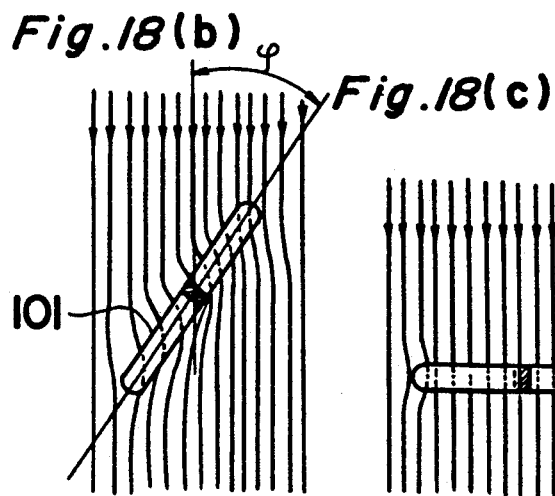
Fig. 18(c)
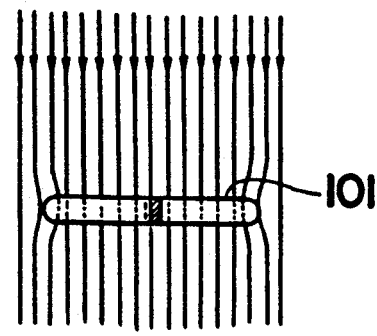

SUPERCONDUCTIVE MAGNETIC SENSOR HAVING SELF INDUCED MAGNETIC BIASING

This application is a divisional of copending application Ser. No. 07/289,312, filed on Dec. 23, 1988, now U.S. Pat. No. 5,011,818.

BACKGROUND OF THE INVENTION

1. Field of the Invention

The present invention relates to a superconductive magneto-resistive device for a magnetic sensor.

2. Description of the Prior Art

Conventionally, a magnetic sensor which utilizes the Hall effect or magneto-resistive effect in a semiconductor or a magnetic sensor which utilizes the magneto-resistive effect in a magnetic material is widely used for sensing or measuring a magnetic field. The former sensor has a sensitivity capable of sensing a magnetic field of about $10^{-2}$ gausses and the latter one has a sensitivity of about $10^{-3}$ gausses.

However, these conventional magnetic sensors have various disadvantages as follows.

They have relatively large specific resistance $R_0$ even when no magnetic field is applied to them.

Each variation ratio of resistance to the magnetic field is represented by a parabolic curve having a small coefficient, as shown in FIG. 1 qualitatively. Since a gain $\Delta R$ in the resistance is increased proportional to the square of the magnetic flux density B of an applied magnetic field, the gain to a weak magnetic field of, for example, several tens gausses is very small and, therefore, a ratio of the gain $\Delta R$ to the specific resistance $R_0$ ($\Delta R/R_0$) is an order of 1% at the most.

On the contrary, a magnetic sensor with use of the SQUID (Superconductive Quantum Interference Device) which utilizes the Josephson junction is known to have a very high sensitivity capable of sensing a very weak magnetic field of about $10^{-10}$ gauss. Structures of tunnel junction, point contact and micro bridge have been known as the Josephson junction.

However, the magnetic sensor of this type has a quite delicate structure in manufacturing and requires a complicated operation upon use of it. Namely, it is not practical for general use although it has a very high sensitivity.

In a copending application U.S. patent application Ser. No. 226,067 which was filed in the name of KATAOKA et al on Jul. 29, 1988, now U.S. Pat. No. 5,011,818, and will be assigned to SHARP KABUSHIKI KAISHA, a superconductive magneto-resistive device is proposed which is comprised of a superconductive material having grain boundaries acting as weak couplings and means for utilizing a change in the resistance of the material caused when a magnetic field is applied thereto.

As shown schematically in FIG. 2, the superconductive material is comprised of superconductive grains 1 and grain boundaries 2 bonding them. These random grain boundaries 2 are considered or supposed to form various weak couplings 3 including tunnel junctions, point contact junctions and micro bridge junctions, as shown by an equivalent network circuit of FIG. 3. In the superconductive phase thereof, individual Cooper pairs can pass freely through weak couplings 3 (Josephson junction) and, therefore, the resistance becomes zero. When a magnetic field is applied to the superconductor, some of Josephson junction 3 are broken thereby and, accordingly, the superconductor has an electric resistance. As a superconductor having grain boundaries, a Y-Ba-Cu-O ceramic superconductor can be used. The critical temperature thereof is about 90 K.

FIG. 4 shows an example of the magnetic sensor system disclosed in the above identified application.

In this system, an elongated rectangular device 4 of ($1 \times 7 \times 0.7$ mm$^3$) which is made of a Y-Ba-Cu-O ceramic superconductive material is prepared and is immersed in liquid nitrogen (77 K). A current is supplied by a power source 9 through a pair of electrodes 5 and 6 formed on respective ends thereof and a voltage between two electrodes 7 and 8 is measured to detect a change in the resistance thereof when a magnetic field B is applied thereto.

FIG. 5 shows the result obtained. As is apparent therefrom, the resistance of the device 4 changes according to the strength I of the applied current and that of the applied magnetic field B. One of merits of this system is that the specific resistance of the device is zero in the superconductive phase and another merit is that the change in the resistance of the device is very steep and, therefore, a very high sensitivity to the magnetic field is obtained.

However, in this system, there is caused such a problem that the magnetic sensor senses a magnetic field induced by the current flowing through the device because of the fine sensitivity thereof. In order to avoid this problem, it is desirable to form the device linearly, as shown in FIG. 7. But, such a linear device induces a magnetic field proportional to the length thereof which causes an error in the measurement of the strength of an external magnetic field to be measured.

SUMMARY OF THE INVENTION

One of the objects of the present invention is to provide a superconductive magneto-resistive device for a magnetic sensor system having a structure in which a magnetic field induced by a current flowing through the device does not affect to an external magnetic field to be measured.

Another object of the present invention is to provide a magnetic sensor being capable of detecting a magnetic field having a one-dimensional or two-dimensional distribution.

In order to achieve these objects, according to the present invention, there is provided a superconductive magneto-resistive device for use in a sensor system for sensing an external magnetic field wherein a current is supplied to said device while keeping it at a temperature close to the critical temperature of the superconductive material forming it and, when an external magnetic field is applied thereto, the change in the resistance thereof caused by the applied magnetic field is detected in order to measure the applied magnetic field being characterized in that said device is formed so as to have a predetermined pattern for a current path through which the supplied current flows; and that said pattern includes portions formed close and parallel to each other so that magnetic fields induced by respective currents flowing through said portions can be cancelled with each other.

According to another object of the present invention, there is provided a sensor system for sensing an external magnetic field comprising plural superconductive magneto-resistive devices, supply means for supplying a constant current to each of said devices, means for cooling said devices at a temperature close to the critical temperature of a superconductive material forming each device, detection means for detecting a change in the resistance of each device being characterized in that said plural devices are arranged so as to form a predetermined pattern.

BRIEF DESCRIPTION OF THE DRAWINGS

This invention may be better understood and its numerous objects and advantages will become apparent to those skilled in the art by reference to the accompanying drawings as follows:

FIGS. 13(I), 13(II) and 13(III) are schematic plan views showing array structures of plural superconductive magneto-resistive devices for detecting a pattern of an external magnetic field, respectively;

FIG. 16 is a front view of a magnetic sensor suitable for detecting an orientation of an external magnetic field according to the present invention;

FIG. 17 is a front view of a superconductive magneto-resistive device used in the magnetic sensor shown in FIG. 16; and FIGS. 18(a), 18(b) and 18(c) are explanatory views for showing the action of the magnetic sensor shown in FIG. 16.

DETAILED DESCRIPTION OF THE PREFERRED EMBODIMENTS

Figure 6:
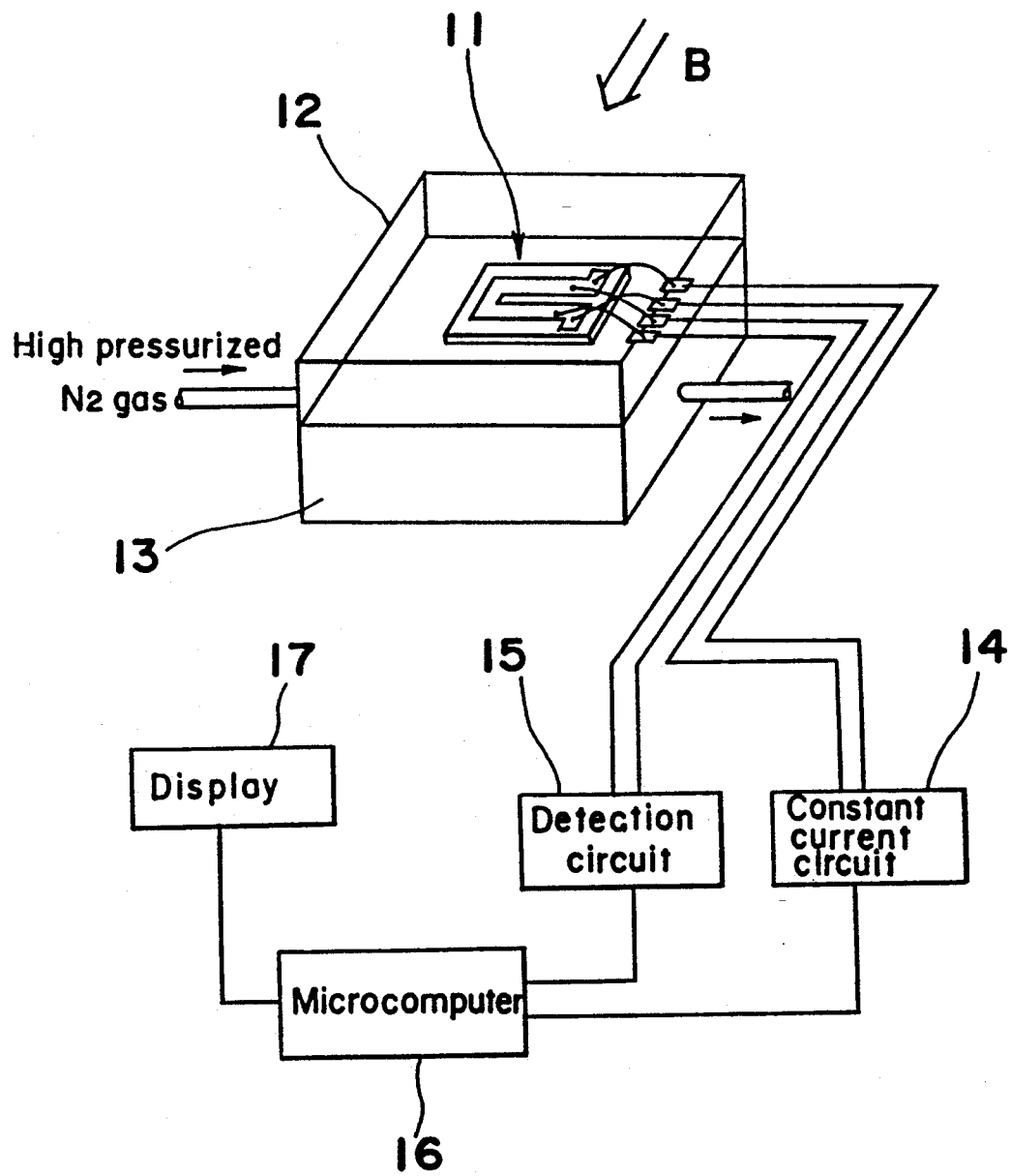
FIG. 6 is a perspective view showing a magnetic sensor system according to the present invention.

FIG. 6 shows a magnetic sensor system according to the present invention.

The magnetic sensor system is comprised of a superconductive magneto-resistive device 11 housed in a package 12 made of a non-magnetic material, a cooling apparatus 13 for cooling the device 11 with use of high pressurized $N_2$ gas so as to keep it in the superconductive state, a circuit 14 for generating a constant current to apply it to the device 11, a detection circuit 15 for detecting a voltage generated in the device 11 and a microcomputer 16 for controlling the constant current generation circuit 14 and processing data outputted from the voltage detection circuit 15. The processed data is displayed on a display 17.

When an external magnetic field B is applied to the device 11 in a direction indicated by an arrow B, the detection circuit 15 measures the voltage generated in the device 11 and the measured voltage is processed by the microcomputer 16 in order to give the strength of the applied magnetic field.

Figure 7:
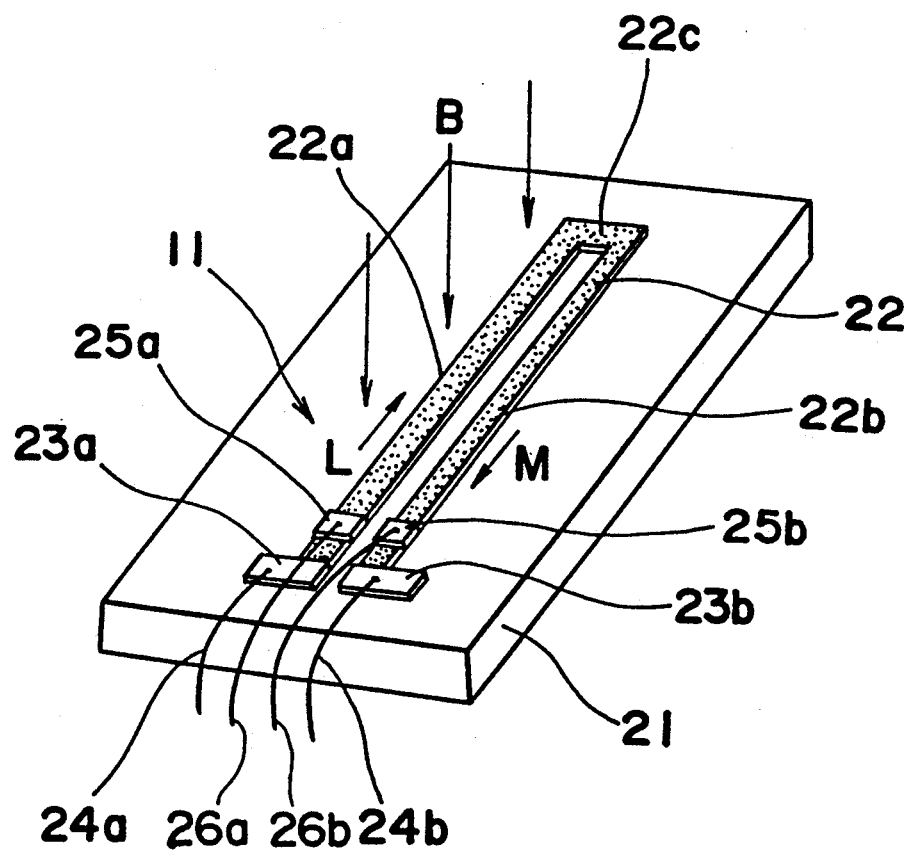
FIG. 7 is an enlarged perspective view of the superconductive magneto-resistive device used in the magnetic sensor system shown in FIG. 6.

FIG. 7 shows the superconductive magneto-resistive device 11.

The device 11 is comprised of a substrate 21 made of alumina ($Al_2O_3$) and a superconductive magneto-resistive element 22 formed on the substrate 21. The element 22 is formed on the substrate 21 as a thin film of a Y-Ba-Cu-O ceramic superconductor with use of the spattering method.

This element 22 has two linear portions 22a and 22b extending parallel to each other with a small distance which are connected by a connection portion 22c at respective ends thereof. On respective free ends of two linear portions 22a and 22b, electrodes 23a and 23b for supplying a current to the device 11 are formed by depositing Ti and lead lines 24a and 24b are connected to the electrodes 23a and 23b in order to apply the constant current from the constant current supplying circuit 14 to the device 11. Further, a pair of electrodes 25a and 25b for measuring a voltage generated in the device 11 are formed on portions of the device 11 near the current electrodes 23a and 23b. Two lead lines 26a and 26b from the voltage detection circuit 15 are connected to these electrodes 25a and 25b, respectively.

When a constant current I is applied to the current electrode 23a, it flows through the first linear portion 22a in a direction indicated by an arrow L and, then, returns through the second linear portion 22b to the current electrode 23b, via the connecting portion 22c, in a direction indicated by an arrow M.

Since the distance between the first and second linear portions 22a and 22b is very small, magnetic fields induced by the currents flowing oppositely through the first and second linear portions 22a and 22b cancel with each other. Therefore, the external magnetic field B to be detected is not affected by these magnetic fields induced along the first and second linear portions 22a and 22b. Thus, the device 11 can detect the strength of the external magnetic field B exactly.

The superconductive element 22 is made with use of a superconductive material of a Y-Ba-Cu-O oxide having a critical temperature of 90 to 100 K. This material is deposited on the substrate of $Al_2O_3$ by spattering in order to form a thin film of the thickness of about 10 $\mu$m. This film is heated up to 900° C. in the air and, then, cooled gradually. The obtained component thereof is $Y_1Ba_2Cu_3O_{7-x}$ ($0<x<1$). The film is processed by etching to form the element 22 on the substrate 21.

This film for the device can be made by various methods such as vacuum evaporation method, CVD method, spray method for spraying a solvent of components of the superconductive material and the like. A substrate made of silicon or $Ba_2TiO_4$ is usable for the substrate of the device 11.

The sensitivity of the superconductive magneto-resistive device is considered to be determined by a radius of grains included therein and the state of grain boundaries.

The ceramic superconductive material can be also made by sintering as follows.

Powders of $Y_2O_3$, $BaCO_3$ and $CuO$ are weighed at a predetermined ratio in order to obtain a component of $Y_1Ba_2Cu_3O_{7-x}$ ($0<x<1$) After grinding and mixing these powders, samples formed with the mixture are calcined at 900° C. for 5 hours in air. Then, the samples are crushed and ground into powder comprised of micro particles having a diameter equal to or smaller than 1 μm. Then, the powder is cold-pressed into samples. Finally, these samples are sintered at 1000° C. for 3 hours in air.

The sensitivity of the superconductive magnetoresistive device made by sintering as mentioned above is greatly dependent on the radius of crushed micro particles.

On the contrary to the sintering method, the diameter of grains forming the superconductive film made by the deposition method is substantially determined by the temperature of the substrate upon depositing the film thereon.

In the preferred embodiment, the ceramic superconductive film is formed by spattering the material on the substrate while keeping it at a temperature of 300° to 400° C. The deposited film is sintered at 950° C. in air and, thereafter, cooled gradually.

The pattern of the device can be formed by irradiating a laser beam, an electron beam or an ion beam onto portions of the film except for the pattern in order to change those into a normal conductive state.

Figure 8:
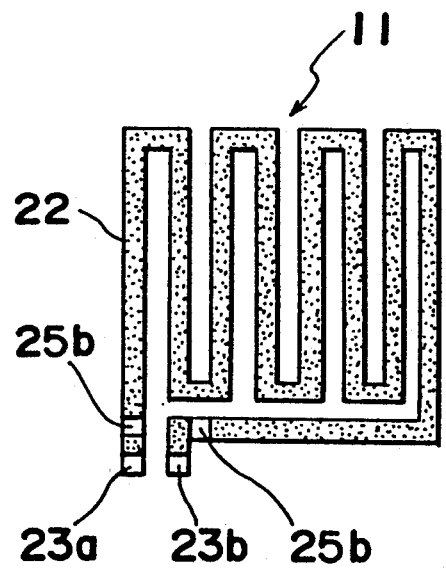
FIG. 8 and FIG. 9 are plan views showing other examples of the superconductive magneto-resistive device, respectively.
Figure 9:
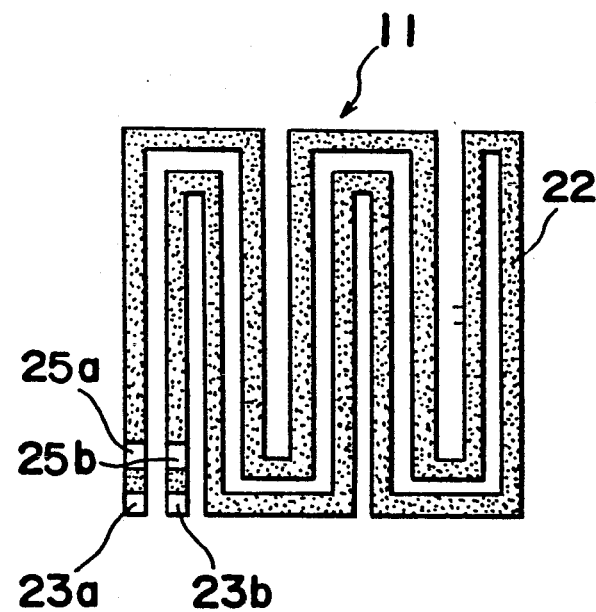

FIG. 8 and FIG. 9 show desirable patterns for the device.

The pattern shown in FIG. 8 has successive four basic patterns shown in FIG. 7 which are formed parallel. This pattern has a length of current path of four times of that of the basic pattern. Accordingly, an output voltage of four times can be obtained in this pattern with the same current. The number of basic patterns can be changed arbitrarily.

The pattern shown in FIG. 9 is formed to have five parallelized portions connected one after another. This pattern has a current path of about five times of that of the basic pattern.

The pattern having a structure for cancelling magnetic fields induced by respective linear portions can be realized not only by a plane pattern but also by a stacked or layered structure.

Figure 10:
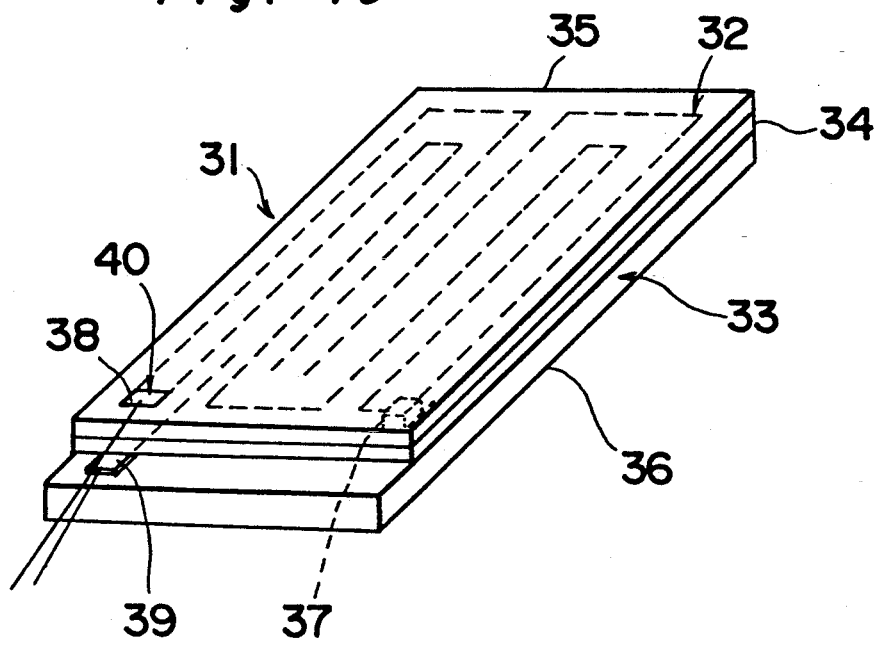
FIG. 10 is a perspective view of a superconductive magneto-resistive device having a layered structure.

FIG. 10 shows an example of such a stacked structure.

In this example, the device 31 is comprised of first and second elements 32 and 33 and an insulation film 34 inserted inbetween them.

Each of the first and second elements 32 and 33 has a linear pattern of a superconductive magneto-resistive material formed on each of substrates 35 and 36, as indicated by a dotted line in FIG. 10. The patterns of the first and second elements 32 and 33 are formed identical with each other.

Each one end of these patterns of the first and second elements 32 and 33 are electrically connected with each other by a through hole 37 formed on the insulation film 34.

On the other ends of these patterns, electrodes 38 and 39 are, respectively, formed for supplying a constant current from the constant current circuit 14. The electrode 38 is drawn out through a through hole 40 to the upper surface of the first substrate 35.

In this structure, the direction of the current flowing through the device is reversed between the pattern of the first element 32 and that of the second element 33 and, therefore, respective magnetic fields induced along the current paths of the first and second elements 32 and 33 are perfectly cancelled with each other.

Figure 11:
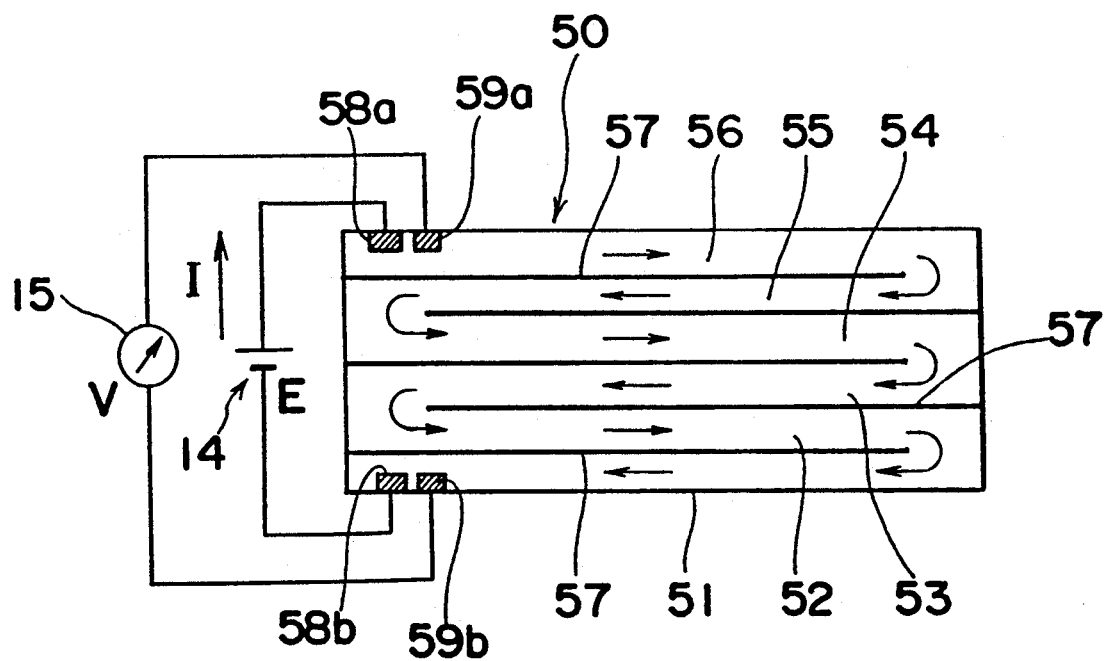
FIG. 11 is an enlarged cross-sectional view of another superconductive magneto-resistive device according to the present invention.

FIG. 11 shows another example of the device 50 having a layered structure.

In this structure, six layers from 51 to 56 of a superconductive magneto-resistive material are deposited one by one and, between adjacent layers, an insulation layer 57 is formed so as to insulate them except for one end portion of them. The insulation layer 57 for insulating the upper pair of the adjacent layers is formed so as to extend in a direction opposite to that of the lower pair of the adjacent layers and, thus, a folded current path is formed in the device 50. On the lower-most and upper-most layers 51 and 56, a pair of electrodes 58a and 58b for supplying a constant current I from the current source 14 and a pair of electrodes 59a and 59b for measuring a voltage generated in the device 50 by the detection circuit such as a potentiometer 15 are formed, respectively.

Since the current is reversed in the direction thereof between the adjacent layers, magnetic fields induced by respective currents flowing through the adjacent layers are perfectly cancelled with each other.

This structure is extremely advantageous in that the output voltage or the resistance to be measured is independent from the strength of the current to be applied to the device because no internal magnetic field is generated in the device 50 and, accordingly, the resistance of the device is determined only by the external magnetic field applied thereto.

Figure 12:
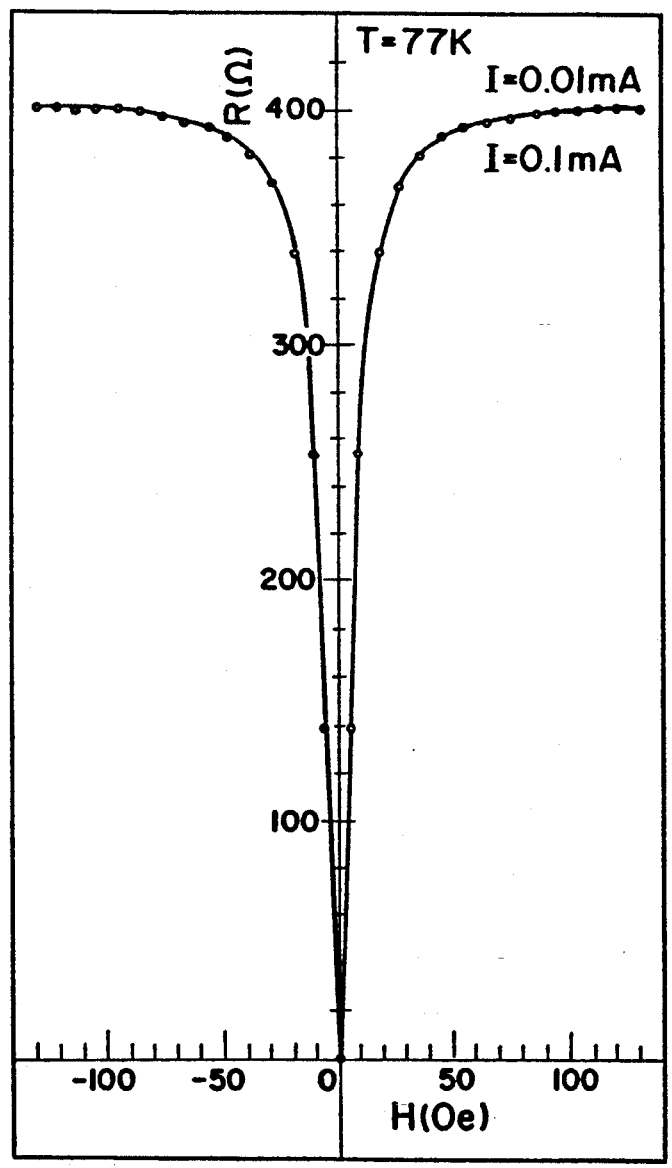
FIG. 12 is a graph showing the magneto-resistive property of the device shown in FIG. 11.

FIG. 12 is a graph showing the result obtained by measurement with use of the device 50 having the structure shown in FIG. 11. The magneto-resistive characteristic obtained when the current of 0.1 mA is supplied substantially coincides with that obtained when the current of 0.01 mA is supplied.

Figure 13:
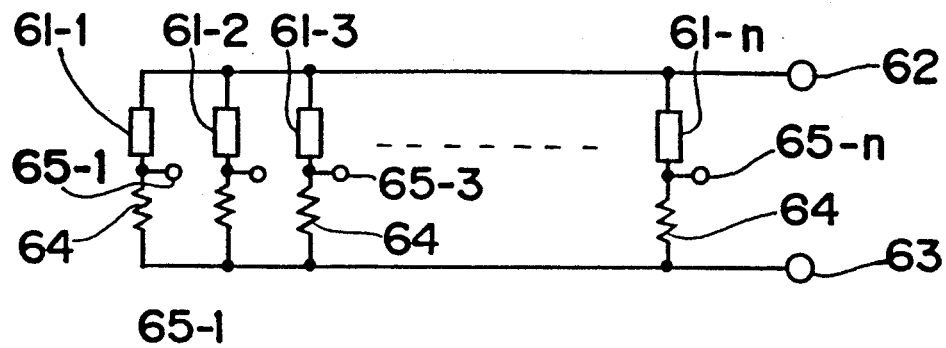
Figure 13:
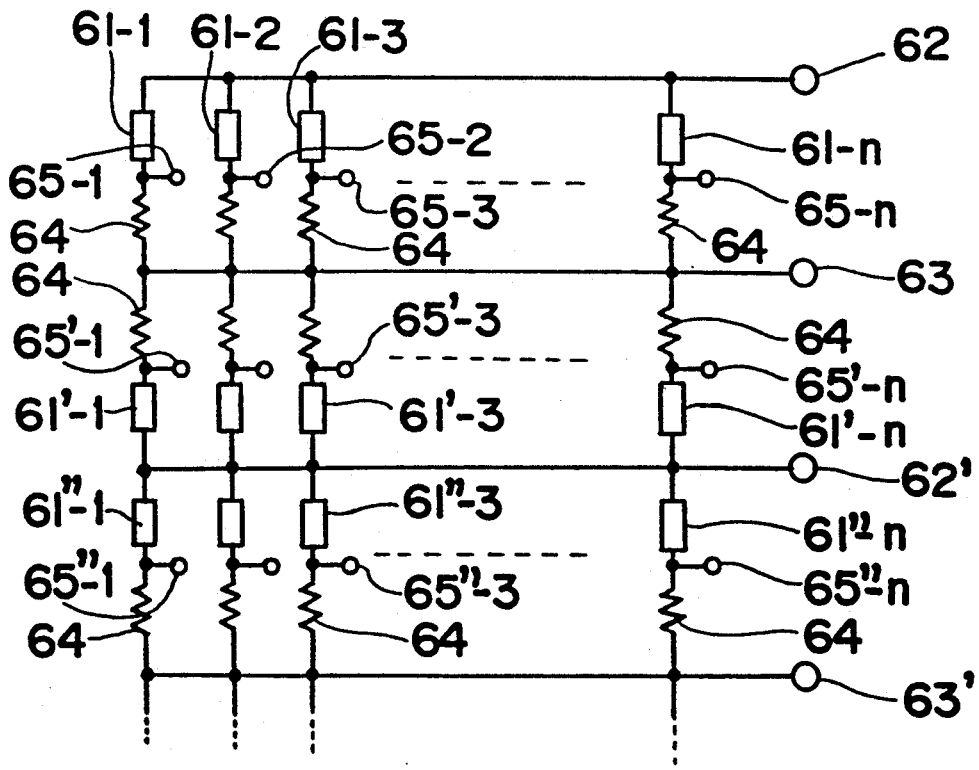

FIGS. 13(I) and 13(II) show one dimensional magnetic array sensor and two dimensional magnetic array sensor, respectively.

In the one dimensional magnetic array sensor, a plurality of superconductive magneto-resistive devices from 61-l to 61-n are connected parallel to each other between lines 62 and 63 connected to a power source.

To each of the devices, a resistance 64 is connected serially and each output terminal 65 is drawn out from a portion between each device and each resistance.

Figure 1:
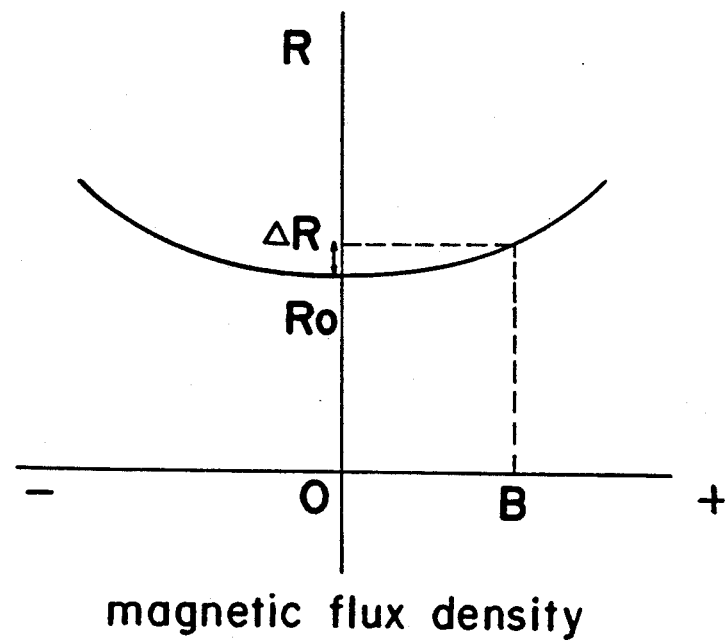
FIG. 1 is a graph showing the magneto-resistive property of a conventional magnetic sensor.
Figure 2:
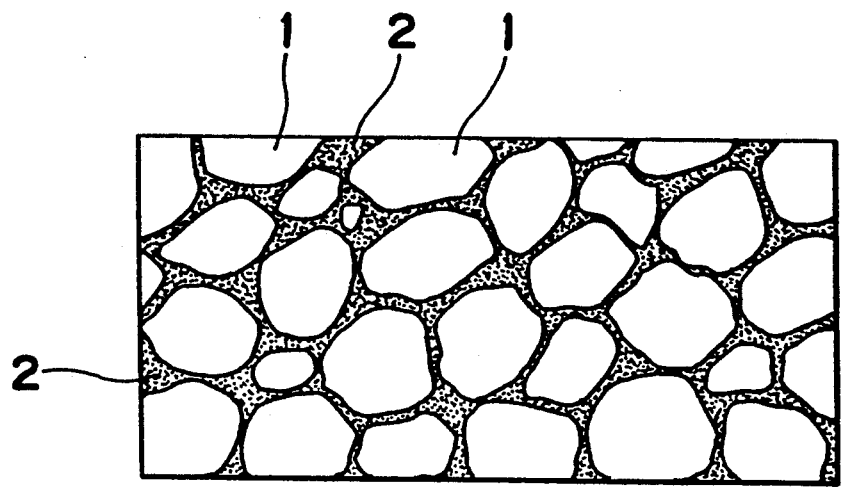
FIG. 2 is an enlarged schematical cross-sectional view of a ceramic superconductor for forming a superconductive magneto-resistive device according to the present invention.
Figure 3:
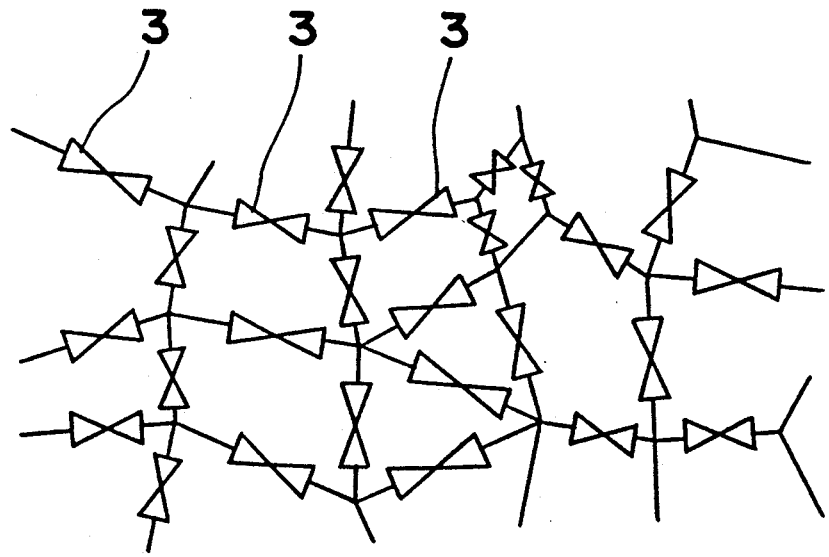
FIG. 3 is an equivalent circuit for showing a network of weak couplings formed in the ceramic superconductor shown in FIG. 2.
Figure 4:
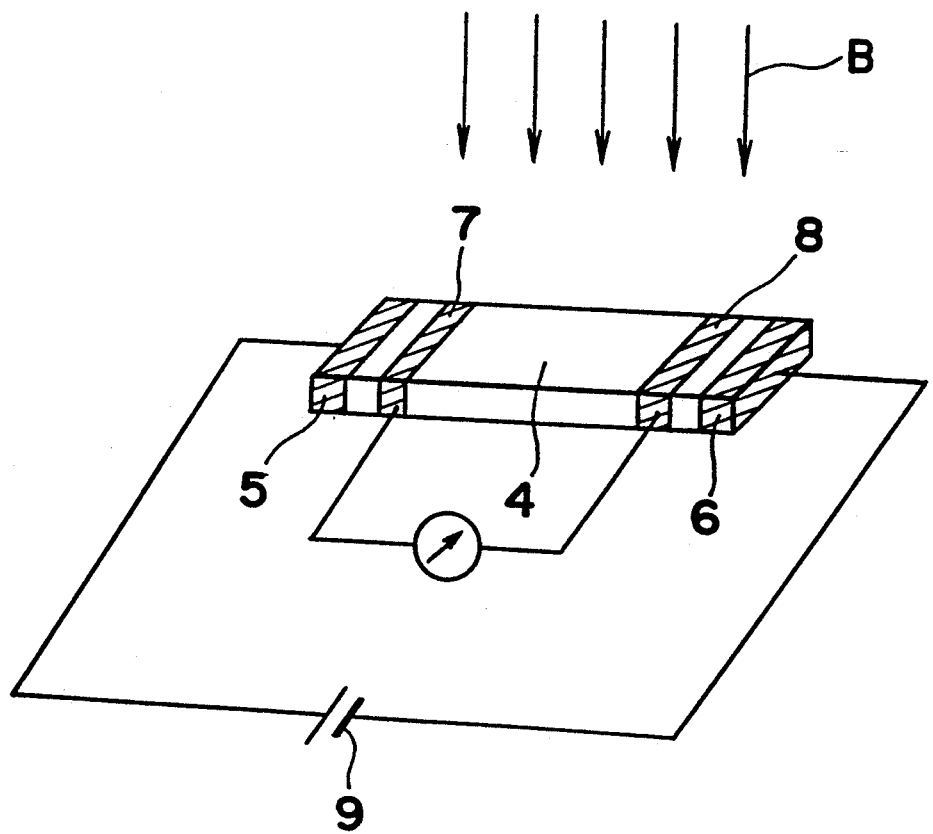
FIG. 4 is a perspective view showing a magnetic sensor disclosed in the copending application of U.S. patent application Ser. No. 226,067.
Figure 5:
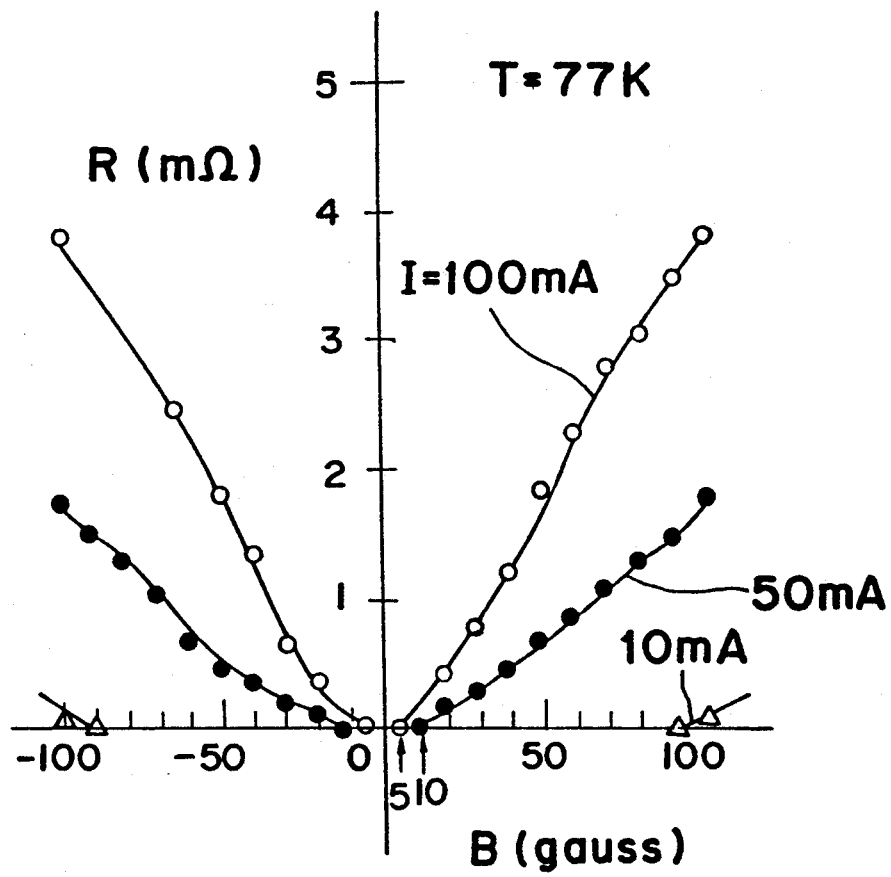
FIG. 5 is a graph showing the magneto-resistive property of the magnetic sensor shown in FIG. 4.

When a magnetic field having one dimensional pattern is applied to the sensor, the pattern is detected based upon data outputted from individual devices 61-l to 61-n of the sensor. The device having such a pattern as shown in either of FIGS. 7 to 11 is desirably used for each device of the sensor. However, the superconductive magneto-resistive device as shown in FIG. 4 can be used for the device of the sensor.

In the two dimensional magnetic array sensor shown in FIG. 13(II), a plurality of superconductive magneto-resistive devices are arranged in a matrix form.

In this case, a two dimensional magnetic pattern can be detected based on data outputted from individual devices.

FIG. 13(III) shows another example of the two dimensional magnetic sensor.

In this magnetic sensor, plural column line devices 71-*l* to 71-*n* are formed on a substrate (not shown) at a predetermined pitch and plural row line devices 81-*l* to 81-*n* are formed at a predetermined pitch so as to form a lattice together with the column line devices 71-*l* to 71-*n*. Each of the row line devices and each of the column line devices are insulated with each other at the crossing portion between them.

Individual one ends of the column line devices are connected to a power source line 75 and individual one ends of the row line devices are connected to another power source line 85. The other end of each of the column line devices is connected to each of other source terminals 76-*l* to 76-*m* via a resistance 77. Also, the other end of each of the row line devices is connected to each of other power source terminals 86-*l* to 86-*n* via a resistance 87. Each of output terminals 78-*l* to 78-*m* is drawn out from a portion between each of the column line devices and the resistance 77. Also, each of output terminals 88-*l* to 88-*n* is drawn out from a portion between each of the row line devices and the resistance 87.

When a magnetic field as indicated by a dotted circle H is applied to the sensor, only two output terminals of the second column line terminals 78-2 and the second row line terminal 88-2 output data corresponding thereto. Accordingly, a two dimensional magnetic field can be detected by scanning the column and row line terminals sequentially.

It is also possible to apply the power to an arbitrary pair of the column line device and the row line device by providing respective switching means for selectively switching on either of the column line devices and for selectively switching either one of the row line devices. If a pair of i-th column line device 71-*i* and j-th row line device 81-*j* are switched on, the magnetic field induced by a current flowing through either one of them is applied to the other device as a bias magnetic filed reciprocally. Due to this, it becomes possible to detect an external magnetic field applied to one of crossing points selectively by the application of the internal bias magnetic field thereto.

Figure 14:
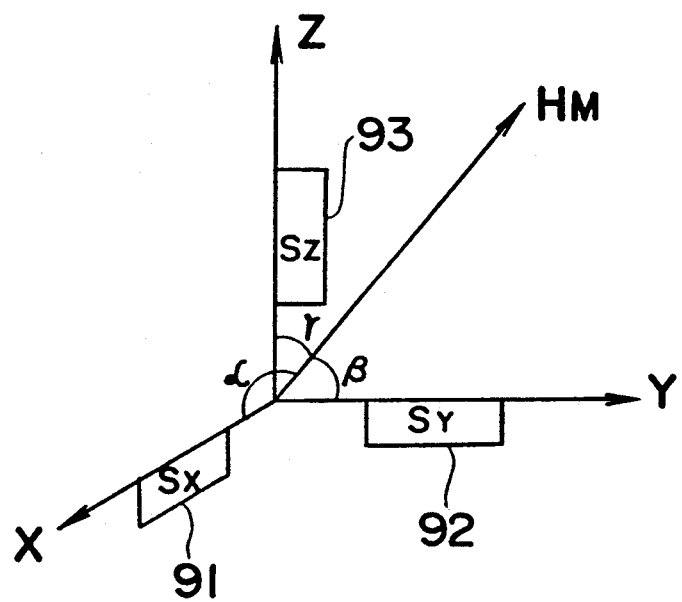
FIG. 14 is a schematic perspective view for showing a three-dimensional array of plural superconductive magneto-resistive devices for detecting the strength and the direction of a magnetic field.

In FIG. 14, a three dimensional magnetic sensor is disclosed. In this sensor, three superconductive magnetoresistive device 91, 92 and 93 are arranged along three orthogonal coordinate axes X, Y and Z, respectively.

When an external magnetic field $H_M$ is applied to the magnetic sensor, the direction and the strength thereof can be calculated based on respective output data from individual devices 91, 92 and 93.

Figure 15:
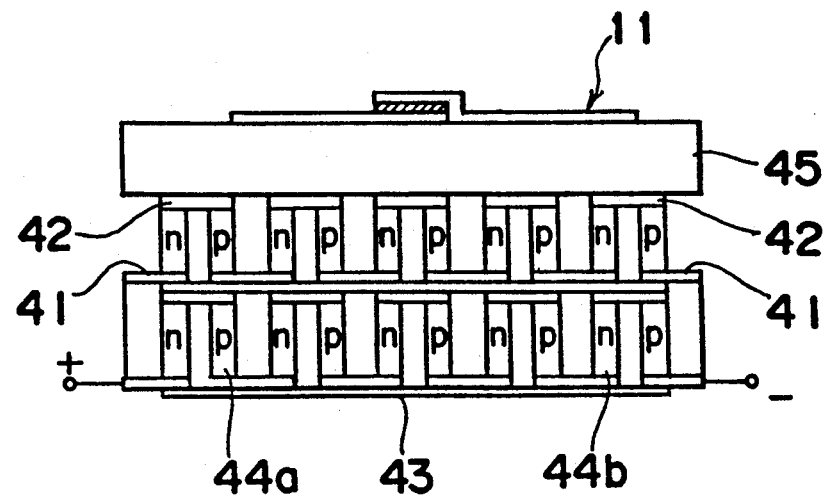
FIG. 15 is a side view of a magnetic sensor having a cooling means according to the present invention.

FIG. 15 shows a cooling apparatus for the device 11 utilizing Peltier effect which is formed as a cascade structure of two stages with use of Peltier effect devices.

In FIG. 15, reference numeral 41 denotes a heat radiation metal plate, reference numeral 42 denotes a cooling metal plate, reference numeral 43 denotes an insulator, reference numerals 44*a* and 44*b* denote p-type and n-type semiconductor devices, respectively, and reference numeral 45 denotes a heat radiation substrate.

FIG. 16 shows another example of a magnetic sensor 101.

This sensor 101 is comprised of two rod-like elements 102 and 102' made of a material having a high permeability and a superconductive magneto-resistive device 103 inserted between two elements 102 and 102'. As shown in FIG. 17, the device 103 is comprised of a substrate 105 and a folded linear pattern element 106 of a superconductive magneto-resistive material deposited thereon. A constant current is applied from a pair of electrodes 107*a* and 107*b* formed on respective end portions of the pattern element 106.

When the magnetic sensor 101 is directed parallel to the magnetic flux of a magnetic field as shown in FIG. 18(*a*), the magnetic flux is converged into rod-like element 102 or 102' and, therefore, a strong magnetic field is applied to the device 103 to generate a high resistance in the device.

On the contrary, if the magnetic sensor 101 is inclined to the magnetic flux of a magnetic field by an angle $\phi$ as shown in FIG. 18(*b*), the magnetic flux is not converged so much into the rod-like element 102 and 102'. Therefore, a magnetic field applied to the device 103 becomes considerably weak. And, if the magnetic sensor 101 is directed perpendicularly to the magnetic flux of a magnetic field, as shown in FIG. 18(*c*), all of the magnetic flux pass freely through each of the rod-like elements 102 and 102' and, therefore, none of the magnetic field is applied to the device 103. Thus the direction of a magnetic field relative to the magnetic sensor can be detected based on data outputted from the device 103.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A superconductive magneto-resistive sensor device for sensing an external magnetic field applied thereto said superconductive device being formed of a material having grain boundaries acting as weak couplings, the superconductive device being formed to have a single predetermined continuous current pattern so as to allow current to flow through the superconductive device;
said predetermined continuous current pattern including means for cancelling magnetic fields induced by a flow of current in said superconductive device;
said means including portions of said continuous pattern formed close to and parallel to each other so that when a current is supplied to said superconductive device while keeping it at a temperature close to the critical temperature of a superconductive material forming the device, a change in resistance of the device caused by an applied magnetic field can be detected in order to measure the applied magnetic field.

2. A superconductive magneto-resistive device as claimed in claim 1, in which said continuous current pattern is formed on a plane.

3. A superconductive magneto-resistive device as claimed in claim 2, in which said predetermined continuous pattern is formed on a substrate by deposition.

4. A superconductive magneto-resistive device as claimed in claim 1, in which said predetermined continuous pattern is formed by a layered structure as viewed in cross-section.

5. A superconductive magneto-resistive device as claimed in claim 1, including current electrodes to apply constant current and further including other electrodes located near said current electrodes for measuring a voltage generated in the device.

6. A sensor system for sensing an external magnetic field comprising:
   plural superconductive magnetic-resistive devices each formed of a material having grain boundaries acting as weak couplings;
   supply means for supplying a constant current to each of said devices.
   means for cooling said devices at a temperature close to the critical temperature of the superconductive material forming each device;
   detection means for detecting a change in the resistance of each said devices each of said devices exhibiting a single predetermined continuous current pattern so as to allow current to flow through each of the superconductive devices;
   said pattern including means for cancelling magnetic fields induced by a flow of current in said predetermined current pattern, said means including portions of said predetermined current pattern formed close to and parallel to each other.

7. A sensor system as set forth in claim 6 in which said devices are arranged in a one-dimensional array.

8. A sensor system as set forth in claim 6 in which said devices are arranged in a two dimensional array.

9. A sensor system as set forth in claim 6, in which said devices are arranged in a matrix pattern formed with plural column and row linear elements orthogonal with each other.

10. A sensor system as set forth in claim 6, in which said devices are arranged in a three-dimensional array.

11. A superconductive magneto-resistive sensor device for sensing an external magnetic field applied thereto said superconductive device being formed of a material having grain boundaries acting as weak couplings, the superconductive device being formed to have a predetermined continuous current pattern so as to allow current to flow through the superconductive device comprising:
   a deposited superconductive material having grain boundaries;
   said superconductive material being in the shape of an open rectangle having two extending longitudinal legs connected by a single shorter leg; and
   said longitudinal legs being parallel to each other and effectively closely to each other so that when current is supplied to the superconductive material while keeping the superconductive material at a temperature close to its critical temperature, the closely space legs will cancel magnetic fields induce by the flow of current.

12. The superconductive magneto-resistive sensor as claimed in claim 1, wherein the superconductive device has a serpentine shape which includes a plurality of pairs, each pair including extending longitudinal parallel portions connected together at their tops by a portion substantially perpendicular to the longitudinal parallel portions;
   and each of said pairs physically connected together by another portion substantially perpendicular to said parallel portions and located at a bottom of said longitudinal parallel portion.

13. The superconductive magneto-resistive sensor according to claim 12 wherein said plurality of pairs intermesh with other plurality of pairs.

* * * * *